(12) United States Patent
Kim

(10) Patent No.: US 6,399,987 B2
(45) Date of Patent: Jun. 4, 2002

(54) MOS TRANSISTOR HAVING SELF-ALIGNED WELL BIAS AREA

(75) Inventor: Gyu-chul Kim, Kyungki-do (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/774,859

(22) Filed: Jan. 31, 2001

(30) Foreign Application Priority Data

Jan. 31, 2000 (KR) .............................................. 00-4677

(51) Int. Cl.[7] .............................................. H01L 31/119
(52) U.S. Cl. ................................... 257/340; 365/185.33
(58) Field of Search ................ 257/340, 369, 257/370

(56) References Cited

U.S. PATENT DOCUMENTS 5,568,422 A * 10/1996 Fujiwara ................ 365/185.33

* cited by examiner

Primary Examiner—David Nelms
Assistant Examiner—Thao P Le
(74) Attorney, Agent, or Firm—Mills & Onello LLP

(57) ABSTRACT

A MOS transistor having a self-aligned well bias area and a method of fabricating the same provide for efficient application of well bias in a highly integrated semiconductor substrate without causing latch-up. The well bias area is formed at a trench, which is formed by etching a semiconductor substrate in a manner of self-alignment, so that well bias can be efficiently applied to the MOS transistor achieving reduction of the area of a chip without degradation of electrical characteristics.

6 Claims, 4 Drawing Sheets

MOS TRANSISTOR HAVING SELF-ALIGNED WELL BIAS AREA

BACKGROUND OF THE INVENTION

1. Field of the Invention

The present invention relates to a method of fabricating a semiconductor device, and more particularly, to a MOS transistor employed in a memory cell and a method of fabricating the same.

2. Description of the Related Art

A MOS transistor, one of the basic components in a semiconductor integrated circuit, is generally formed in an N-type or P-type well. Here, with the exception of special cases, a drain voltage Vdd is applied to the N wells, and a source voltage Vss is applied to the P wells. When a plurality of NMOS transistors are included in a single P well, only a single common contact is formed for applying well bias to the plurality of NMOS transistors, in order to reduce the chip area, instead of forming a plurality of contacts for individual NMOS transistors. When a single, common contact-type bias contact is used, a problem such as a "latch-up" phenomenon may occur in NMOS transistors located relatively far away from the well bias contact due to resistance, which increases in proportion to the distance between an NMOS transistor and its contact. The latch-up is a phenomenon that occurs when a MOS transistor is abnormally turned on due to a change in external voltage, electrical noise or ion radiation, thereby abnormally changing the electrical characteristics of the transistor or damaging the transistor.

Individual formation of well bias contacts for each of a plurality of NMOS transistors is preferred to prevent the latch-up phenomenon, but this tends to increase the size of a chip. Achieving good electrical characteristics conflicts with reducing the size of a chip, and it is not desirable to sacrifice either aspect. For a compromise between improvement of electrical characteristics and reduction of a chip size, a method of forming a well bias contact for every pair of two transistors has been proposed.

FIG. 1 is a sectional view for illustrating a well bias area region of a typical MOS transistor. Referring to FIG. 1, two gate patterns, each of which includes a gate oxide film 12, a gate electrode 14, a capping layer 16 and a gate spacer 18, are formed on a semiconductor substrate 10 having a P-well of a first conductivity type. N-type impurity regions referred to as source/drain regions 26, of a second conductivity type are formed around each gate pattern on the semiconductor substrate 10. Reference numeral 20 denotes an interlayer insulating film, and reference numeral 22 denotes a contact for the source/drain region 26. Reference numeral 24 denotes a well bias area which is formed by ion-implantation of impurities of the first conductivity type into the semiconductor substrate 10.

Reference numeral 22 denotes a contact to which voltage Vdd for a transistor is applied. Reference numeral 22' serves as both a contact for the application of voltage Vss and a contact for the application of well bias voltage.

There is a limitation as to how much the area of a contact for applying well bias to typical NMOS transistors in a semiconductor substrate can be reduced, since the reduction may deteriorate the electrical characteristics of a MOS transistor. Accordingly, there is a limitation in improving the integrity of a semiconductor device by reducing the contact area for a MOS transistor.

SUMMARY OF THE INVENTION

To address the above limitations, it is a first object of the present invention to provide a MOS transistor having a self-aligned well bias area, in which higher integrity can be achieved by reducing the chip area while its electrical characteristics are sustained without causing a latch-up phenomenon.

It is a second object of the present invention to provide a method of fabricating the MOS transistor having a self-aligned well bias area.

To achieve the first object of the invention, the present invention provides a MOS transistor having a self-aligned well bias area. The MOS transistor includes: a semiconductor substrate on which a well of a first conductivity type is formed; at least two gate patterns, each of which includes a gate oxide film, a gate electrode and a capping layer, which are sequentially stacked on the semiconductor substrate, and a gate spacer, which is formed on the sidewalls of the gate electrode and the capping layer; source/drain regions doped with second conductivity type impurities, the source/drain regions being formed in the surface of the semiconductor substrate adjacent to the gate patterns; a trench formed between the gate patterns by etching the semiconductor substrate in a manner of self-alignment using the gate spacer; a well bias area formed at the side of the lower portion and the bottom of the trench; and a contact filling the trench.

The capping layer is preferably an oxide film or a multiple film including an oxide film, and the contact is formed of tungsten (W).

Each of the source/drain regions is composed of an LDD region and a high concentration impurity region. The depth of the trench is formed to pass through the source/drain region and come in contact with the first conductivity type well of the semiconductor substrate. The butted contact is connected to the source/drain region at the side of the upper portion of the trench.

To achieve the second object of the invention, the present invention provides a method of fabricating a MOS transistor having a self-aligned well bias area. The method includes the following steps. A gate oxide film, a gate electrode and a capping layer are sequentially stacked on a semiconductor substrate with a first conductivity type well. Thereafter, the capping layer and the gate electrode are patterned, and ion-implantation is performed using the gate electrode as an ion-implantation mask, thereby forming LDD region. Subsequently, a gate spacer is formed. Second conductivity type impurities are ion-implanted in the semiconductor substrate using a gate pattern with the gate spacer as an ion-implantation mask, thereby forming a high concentration impurity region. A photoresist pattern is formed on the resultant structure such that the high concentration impurity region between gate patterns is exposed. Next, the semiconductor substrate is etched in a self-aligning manner using the photoresist pattern, thereby forming a trench deep enough to pass through the high concentration impurity region and to come in contact with the first conductivity type well. First conductivity type impurities are ion-implanted in the side of the lower portion and the bottom of the trench, thereby forming a well bias area. Finally, the photoresist pattern is removed and the trench is filled with conductive material, thereby forming a contact.

The capping layer is preferably formed of an oxide film or a multiple layer including an oxide film to a thickness of 2000–4000 Å, and its contact is formed of tungsten.

The above method may further include the step of forming an interlayer insulating film on the entire surface of the semiconductor substrate to cover the gate pattern after forming the high concentration impurity region.

A preferred depth of the trench from the surface of the semiconductor substrate is 0.2–0.8 μm, and the amount of ion-implantation for forming the well bias area is 1E13–1E15 ions/cm$^2$.

The contact is formed by sufficiently depositing a conductive material on the semiconductor substrate and planarizing the surface of the resultant structure using a chemical mechanical polishing (CMP) process during which the capping layer is used as a polishing stopper.

According to the present invention, the contact is formed in the trench so that circuits having a high integration density can be obtained due to reduction of the area occupied by the circuit on a chip, without degradation of the electrical characteristics of the MOS transistors.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF PREFERRED EMBODIMENTS

Hereinafter, embodiments of the present invention will be described in detail with reference to the attached drawings.

MOS Transistor Having a Self-Aligned Well Bias Area

Figure 1:
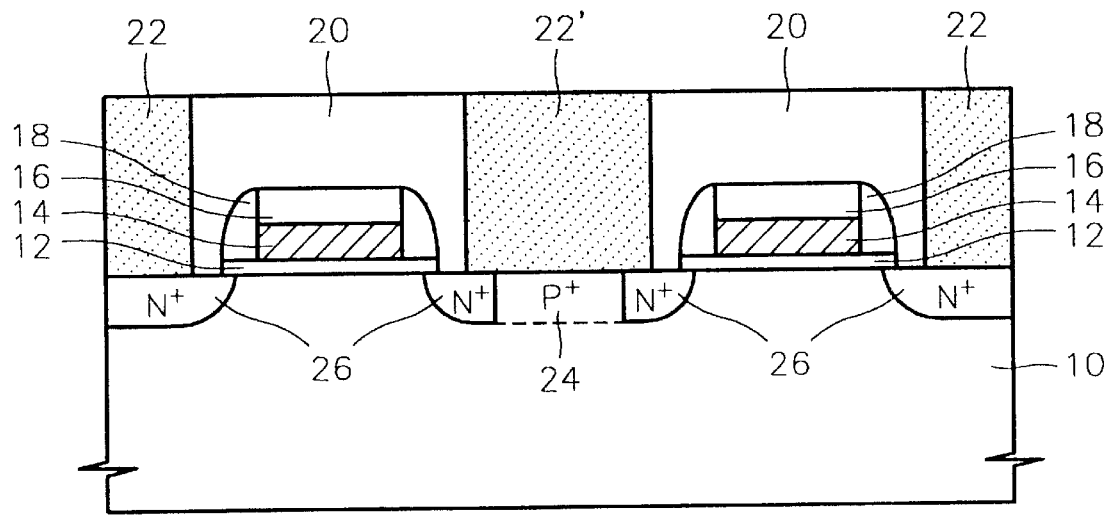
FIG. 1 is a sectional view illustrating the well bias area region of a typical MOS transistor.
Figure 2:
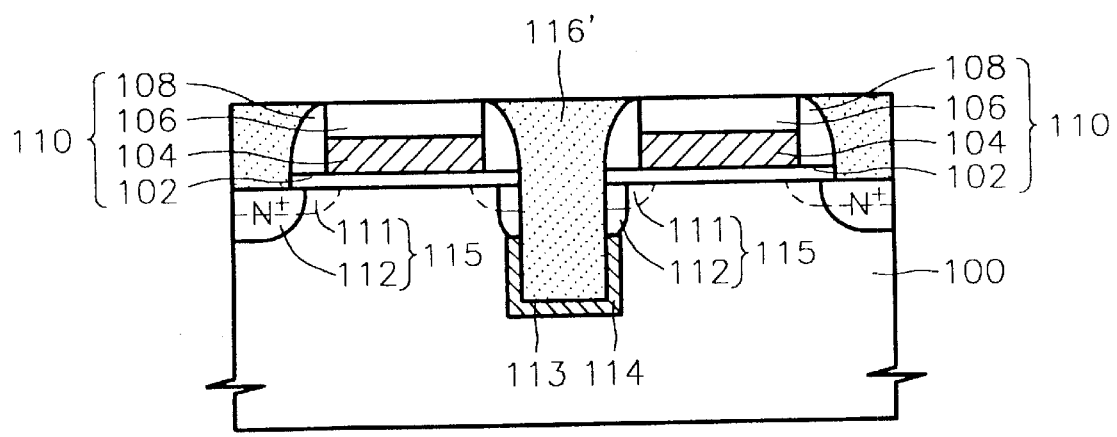
FIG. 2 is a sectional view illustrating the well bias area region of a MOS transistor according to the present invention.

Referring to FIG. 2, a MOS transistor having a self-aligned well bias area includes: a semiconductor substrate 100 on which a well of a first conductivity type is formed; at least two gate patterns 110, each of which includes a gate oxide film 102, a gate electrode 104 and a capping layer 106 sequentially stacked on the semiconductor substrate 100, and a gate spacer 108 formed on the sidewalls of the gate electrode 104 and the capping layer 106; source/drain regions 115 doped with second conductivity type impurities formed near the gate patterns 110 and between which a channel area below each gate pattern 110 is interposed; a trench 113 formed between the gate patterns 110 by etching the semiconductor substrate 100 in a self-aligning manner using the gate spacer 108; a well bias area 114 formed around the lower portion of the trench 113; and a butted contact 116' filling the self-aligned trench 113.

Each of the source/drain regions 115 is composed of an LDD area 111 and a high concentration impurity region 112. The capping layer 106 may be formed of an oxide film or a multiple layer including an oxide film. The butted contact 116' may be formed of a conductive material such as tungsten. The well bias area 114 is preferably formed so that the concentration of the first conductivity type impurities is 1E18–1E20 ions/cm$^3$.

The butted contact 116' formed between the two gate patterns 110 is connected to the source/drain regions 115 at the upper side portion of the trench 113 and to the well bias area 114 at the lower side and bottom portion of the trench 113.

Accordingly, a wider area to which well bias is applied can be obtained in a limited small area, thereby preventing problems such as latch-up phenomenon, even in the case of increased integration, where the size of the well bias area is reduced and the chip size is decreased.

Method of Fabricating a MOS transistor Having Self-Aligned Well Bias Area

FIGS. 3 through 8 are sectional views for explaining a method of fabricating a MOS transistor having a self-aligned well bias area according to the present invention.

Figure 3:
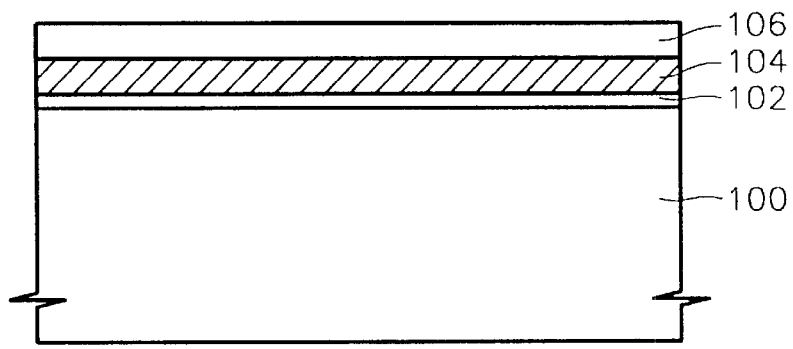
FIGS. 3 through 8 are sectional views illustrating a step-by-step method of fabricating a MOS transistor having a self-aligned well bias area according to the present invention.

Referring to FIG. 3, a gate oxide film 102, a gate electrode 104 formed of polysilicon, and a capping layer 106 formed of an oxide film or a multiple layer including an oxide film are sequentially stacked on a semiconductor substrate 100 having a well of the first conductivity type, such as a P-type. The gate electrode 104 and the capping layer 106 are deposited to a preferred thickness of 2,000–4,000 Å.

Figure 4:
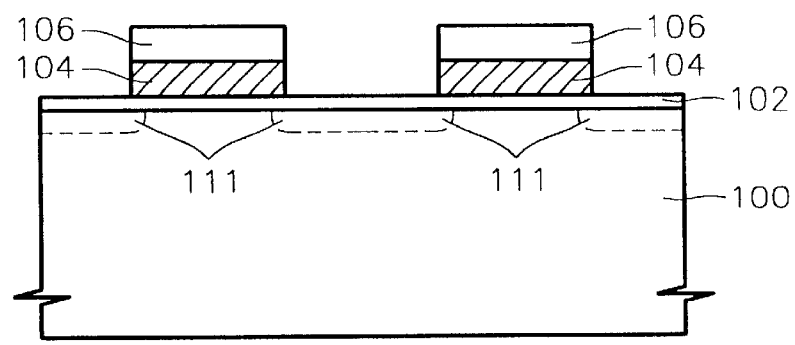

Referring to FIG. 4, a photoresist film (not shown) is deposited on the capping layer 106, and a photolithographic process is performed, thereby patterning the underlying capping layer 106 and the polysilicon gate electrode 104. Thereafter, impurities of the second conductivity type such as N-type impurities are ion-implanted in the semiconductor substrate 100 at 5E13–1E15 ions/cm$^2$ using the patterned capping layer 106 and the gate electrode 104 as an ion-implantation mask. After ion-implantation, the semiconductor substrate 100 is heat-treated, thereby forming LDD regions 111 on the surface of the semiconductor substrate 100.

Figure 5:
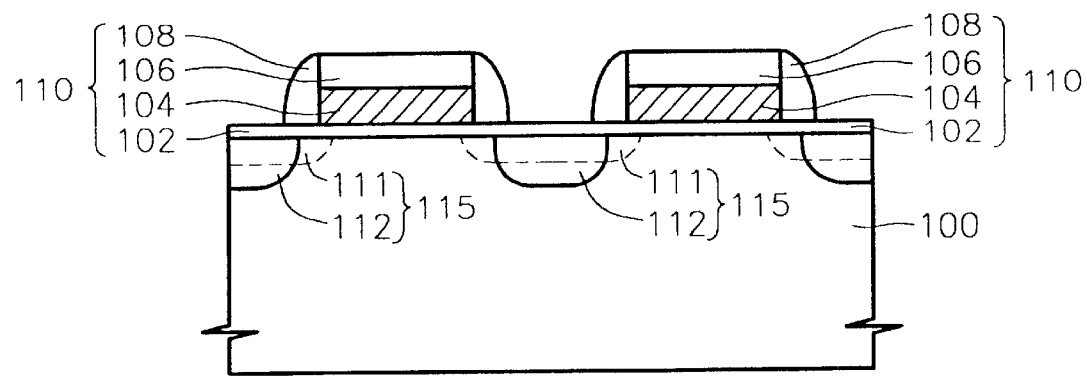

Referring to FIG. 5, an insulating film such as a nitride film for a gate spacer is deposited on the entire surface of the semiconductor substrate 100 to a thickness of 1,000–3000 Å. Next, an anisotropic dry etching process is performed on the insulating film, thereby forming a gate spacer 108 on the sidewalls of the capping layer 106 and the gate electrode 104. Second conductivity type impurities are ion-implanted in the semiconductor substrate 100 at a high concentration of 3E15 ions/cm$^2$ or above using the gate pattern 110 as an ion-implantation mask. After the ion-implantation, the semiconductor substrate 100 is heat-treated to form a high concentration impurity region 112, thereby forming source/drain regions 115 composed of the LDD region 111 and the high concentration impurity region 112.

Figure 6:
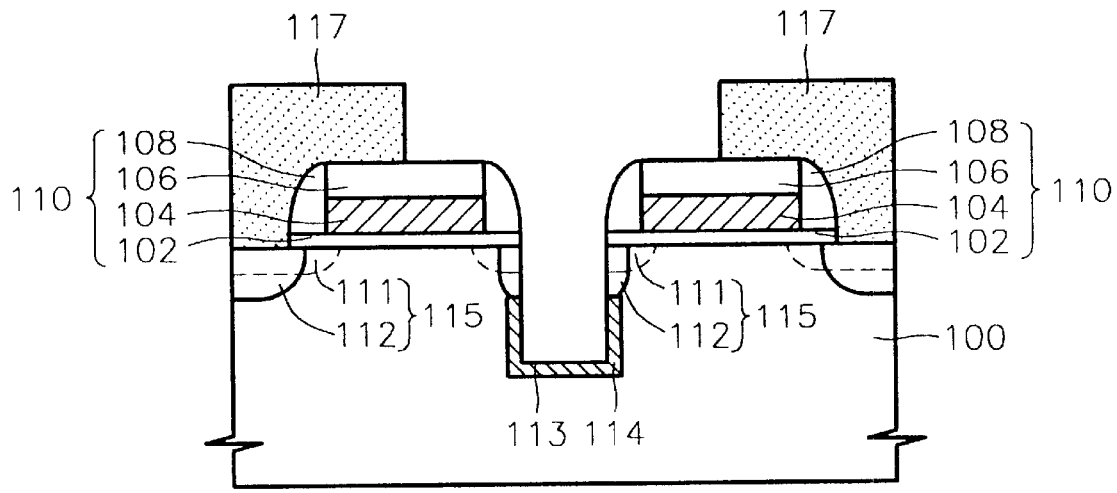

Referring to FIG. 6, the gate oxide film 102 is etched on the semiconductor substrate 100 and a photoresist pattern 117 is formed. The photoresist pattern 117 is formed so that the portion between the two gate patterns 110 is exposed. Thereafter, a part of the semiconductor substrate 100 is etched using the photoresist pattern 117 in a self-aligning manner, thereby forming a trench 113. The trench 113 is positioned to pass through the source/drain region 115 and come in contact with the first conductivity type well formed on the semiconductor substrate 100. Accordingly, the depth of a trench may vary with the type of semiconductor device employing a corresponding MOS transistor. A preferred trench depth of a MOS transistor for a static random access memory (SRAM) is about 0.2–0.8 μm from the surface of the semiconductor substrate 100.

Alternatively, an interlayer insulating film (not shown) may additionally be formed on the entire surface of the semiconductor substrate 100 before forming the photoresist pattern 117 in another embodiment. In this manner, the gate electrode 104 can be protected against potential damage while the trench 113 is being etched. Like the capping layer 106, the interlayer insulating film is preferably formed of a single film or multiple film including an oxide film or a nitride film.

The formation process of the photoresist pattern 117 does not require high precision as self-aligned etching is performed by using the exposed capping layer 106 and gate spacer 108, making a slight misalignment a non-crucial factor.

First conductivity type impurities are ion-implanted in the semiconductor substrate 100 with the photoresist pattern 117 at about 1E13–1E15 ions/cm$^2$, thereby forming a well bias area 114. Thereafter, heat treatment is applied to stabilize the ion-planted impurities. A preferred concentration of the first conductivity type impurities in the well bias area 114 is maintained at 1E18–1E20 ions/cm$^3$ upon completion of the heat treatment.

Figure 7:
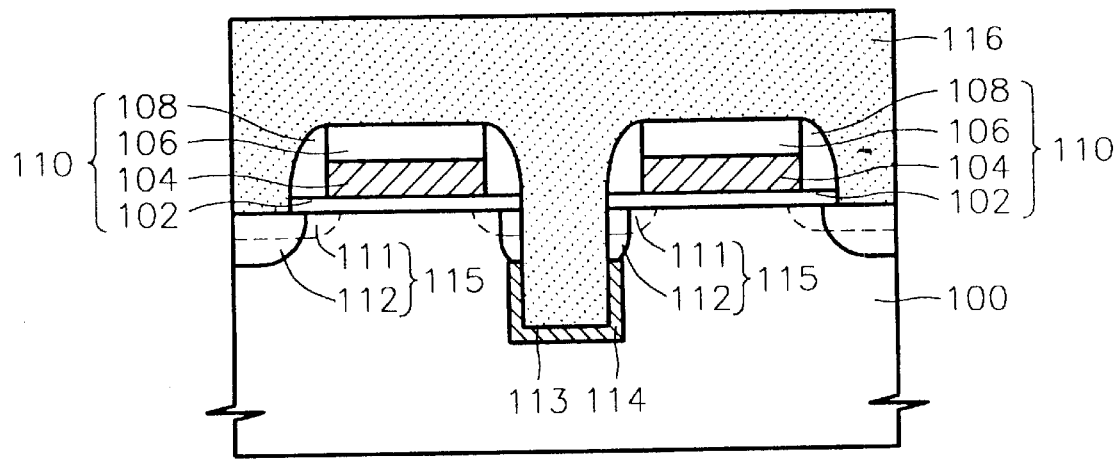

Referring to FIG. 7, the photoresist pattern 117 is removed from the semiconductor substrate 100 after completing the formation of the well bias area 114. Subsequently, a conductive material such as a tungsten (W) layer is deposited so as to be thick enough to fill the trench 113 and cover the entire surface of the semiconductor substrate 100.

Figure 8:
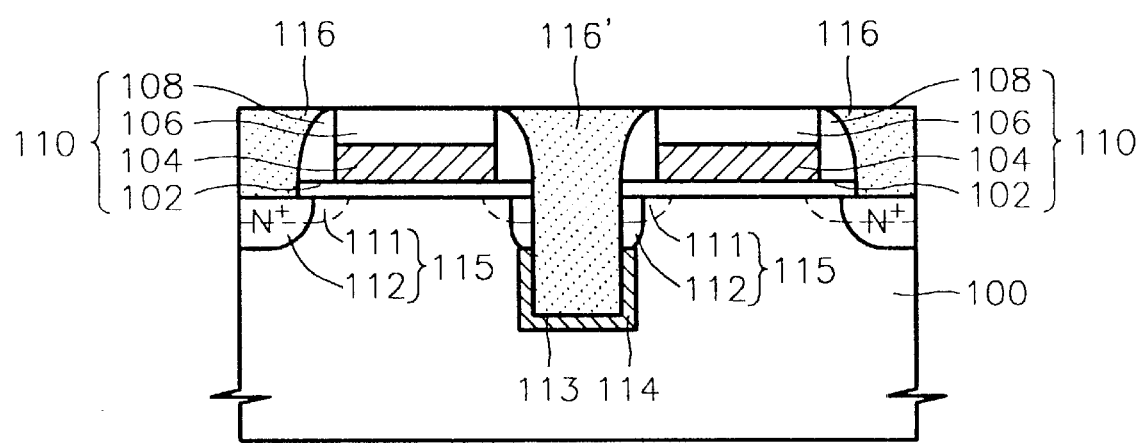

Referring to FIG. 8, the entire surface of the semiconductor substrate 100 with the tungsten layer 116 is planarized by a chemical mechanical polishing (CMP) process, thereby forming source/drain contacts 116 and a butted contact 116'. The capping layer 106 of the gate pattern 110 serves as a polishing stopper during the CMP process. Accordingly, the butted contact 116' for application of a well bias voltage is formed between the two gate patterns 110, and the source/drain contacts 116 made of tungsten are formed at the outer sides of the gate patterns 110.

According to the present invention, misalignment is prevented since a well bias contact area is formed in a self-aligning manner. Also, since well bias is applied using a trench in the same area, bias can be efficiently applied to a well area without causing a latch-up phenomenon. Lastly, high semiconductor integration can be advantageously achieved since the contact well area can be enlarged by adjusting the trench depth for forming the well bias contact.

The present invention is not restricted to the particular embodiment described above, and it will be apparent to one of ordinary skill in the art that modifications of the described embodiment may be made without departing from the spirit and scope of the invention.

What is claimed is:

1. A MOS transistor having a self-aligned well bias region, the MOS transistor comprising:
    a semiconductor substrate on which a well of a first conductivity type is formed;
    at least two gate patterns, each of which includes a gate oxide film, a gate electrode and a capping layer which are sequentially stacked on the semiconductor substrate, and a gate spacer formed on the sidewalls of the gate electrode and the capping layer;
    source/drain regions doped with second conductivity type impurities, the source/drain regions formed in the surface of the semiconductor substrate adjacent to the gate patterns;
    a trench formed between the gate patterns by etching the semiconductor substrate in a manner of self-alignment using the gate spacer, wherein the trench is formed to a depth so as to pass through the source/drain regions and come in contact with the first conductivity type well of the semiconductor substrate;
    a well bias area formed at the side of the lower portion and the bottom of the trench; and
    a contact filling the self-aligned trench.

2. The MOS transistor of claim 1, wherein the capping layer comprises one of an oxide film and a multiple film including an oxide film.

3. The MOS transistor of claim 1, wherein each of the source/drain regions is composed of an LDD region and a high concentration impurity region.

4. The MOS transistor of claim 1, wherein the well bias area is doped with first conductivity type impurities at a concentration of 1E18–1E20 ions/cm$^3$.

5. The MOS transistor of claim 1, wherein the contact is connected to the source/drain region at the side of the upper portion of the trench.

6. The MOS transistor of claim 1, wherein the contact is formed of tungsten (W).

* * * * *